(12) United States Patent
Lim et al.

(10) Patent No.: US 11,967,514 B2
(45) Date of Patent: Apr. 23, 2024

(54) APPARATUS AND METHOD FOR CONTROLLING PROCESS

(71) Applicant: SEMES CO., LTD., Chungcheongnam-do (KR)

(72) Inventors: Sung Min Lim, Chungcheongnam-do (KR); Han Soo Cho, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 619 days.

(21) Appl. No.: 17/151,744

(22) Filed: Jan. 19, 2021

(65) Prior Publication Data
US 2021/0233786 A1 Jul. 29, 2021

(30) Foreign Application Priority Data
Jan. 29, 2020 (KR) ........................ 10-2020-0010177

(51) Int. Cl.
*G05B 19/418* (2006.01)
*H01L 21/67* (2006.01)
(Continued)

(52) U.S. Cl.
CPC .. *H01L 21/67253* (2013.01); *G05B 19/41875* (2013.01); *H01L 21/67742* (2013.01);
(Continued)

(58) Field of Classification Search
CPC .... G05B 19/41875; G05B 2219/31437; G05B 2219/32368
(Continued)

(56) References Cited

U.S. PATENT DOCUMENTS 6,478,532 B1 * 11/2002 Coady .................. H01L 21/681
414/941
9,136,150 B2 9/2015 Hayashi et al.
(Continued)

FOREIGN PATENT DOCUMENTS

JP 2018190845 A 11/2018
KR 101039441 B1 6/2011
(Continued)

OTHER PUBLICATIONS

Korean Notification of Reason for Refusal issued in Korean Patent Application No. 10-2020-0010177, dated Aug. 30, 2021, with translation, 8 pages.

*Primary Examiner* — Jigneshkumar C Patel
(74) *Attorney, Agent, or Firm* — BUCHANAN INGERSOLL & ROONEY PC (57) ABSTRACT

An apparatus and a method for controlling a process are provided. An apparatus for controlling a process includes a processor, and a memory for storing a plurality of instructions executed by the processor, in which the plurality of instructions include an instruction for determining deviation tendency of a seating point of a substrate with respect to a seating center point of a substrate support based on a seating point data created by accumulating the seating points of the substrate seated on the substrate support, an instruction for determining an alarm level according to the determined deviation tendency, and an instruction for performing post-processing according to the determined alarm level, in which the seating point data includes a change of the seating point over time.

15 Claims, 8 Drawing Sheets

(51) Int. Cl.
  *H01L 21/677*   (2006.01)
  *H01L 21/687*   (2006.01)
(52) U.S. Cl.
  CPC .............. *H01L 21/68707* (2013.01); *G05B 2219/31437* (2013.01); *G05B 2219/32368* (2013.01)
(58) Field of Classification Search
  USPC ........................................................ 700/110
  See application file for complete search history.

(56) References Cited

U.S. PATENT DOCUMENTS

| | | | |
|---|---|---|---|
| 2013/0202388 A1* | 8/2013 | Hayashi | H01L 21/67742 414/222.02 |
| 2018/0319075 A1 | 11/2018 | Asano | |
| 2019/0355604 A1 | 11/2019 | Kawabe | |
| 2020/0058530 A1* | 2/2020 | Wang | H01L 21/681 |
| 2020/0144097 A1* | 5/2020 | Thaulad | H01L 21/68785 |

FOREIGN PATENT DOCUMENTS

| | | |
|---|---|---|
| KR | 20130091269 A | 8/2013 |
| KR | 101329699 B1 | 11/2013 |
| KR | 101927698 B1 | 12/2018 |
| KR | 20190131427 A | 11/2019 |

* cited by examiner

APPARATUS AND METHOD FOR CONTROLLING PROCESS

CROSS-REFERENCE TO RELATED APPLICATION

This application claims priority from Korean Patent Application No. 10-2020-0010177 filed on Jan. 29, 2020 in the Korean Intellectual Property Office, and all the benefits accruing therefrom under 35 U.S.C. 119, the contents of which in their entirety are herein incorporated by reference.

BACKGROUND

1. Technical Field

The present invention relates to an apparatus and method for controlling a process in which a movement offset of a robot is set by accumulating data on a seating point of a substrate.

2. Description of the Related Art

When manufacturing a semiconductor device or a display device, various processes such as photographing, etching, ashing, ion implantation, thin film deposition, or cleaning are performed. Here, the photographic process includes application, exposure, and development processes. A photoresist is applied on a substrate (i.e., an application process), a circuit pattern is exposed on the substrate on which a photoresist film is formed (i.e., an exposure process), and the exposed area of the substrate is selectively developed (i.e., a developing process).

The substrate may be input into a process chamber for processing the substrate. The process chamber may be provided with a fixing means such as an electro static chuck (ESC). The processing of the substrate may be performed while the substrate is fixed to the fixing means.

A robot may be used to transport and seat the substrate. The robot may transport the substrate between different process chambers or between a carrier loading the substrate and the process chamber.

SUMMARY

Aspects of the present invention provide an apparatus and method for controlling a process in which a robot's movement offset is set by accumulating data on a seating point of a substrate.

However, aspects of the present invention are not restricted to those set forth herein. The above and other aspects of the present invention will become more apparent to one of ordinary skill in the art to which the present invention pertains by referencing the detailed description of the present invention given below.

An aspect of an apparatus for controlling a process of the present invention includes a processor, and a memory for storing a plurality of instructions executed by the processor, in which the plurality of instructions include an instruction for determining deviation tendency of a seating point of a substrate with respect to a seating center point of a substrate support based on a seating point data created by accumulating the seating points of the substrate seated on the substrate support, an instruction for determining an alarm level according to the determined deviation tendency, and an instruction for performing post-processing according to the determined alarm level, in which the seating point data includes a change of the seating point over time.

The seating point data includes listing seating distances between the seating center point and the seating point of the substrate in chronological order.

The instruction for determining the alarm level determines the alarm level by comparing the amount of change in the seating point per unit time with a preset threshold change amount.

The alarm level includes a first alarm level in which a magnitude of a change in the seating point per unit time exceeds a first threshold change amount, and a second alarm level in which the magnitude of the change in the seating point per unit time exceeds a second threshold change amount greater than the first threshold change amount.

The instructions for performing the post-processing include an instruction for generating an alarm in case of the first alarm level, and an instruction for controlling a transfer robot that moves the substrate in case of the second alarm level.

The instruction for controlling the transfer robot include an instruction for determining a direction and a distance of the seating point deviated from the seating center point, and an instruction for setting a movement offset of the transfer robot according to the determined direction and distance.

The instruction for determining the direction and distance of the seating point determines that the direction and distance of the seating point deviated from the seating center point among a seating point group formed by a plurality of seating points in which the magnitude of the change in the seating point per unit time exceeds the second threshold change amount are the direction and distance of the seating point farthest from the seating center point.

The instruction for determining the direction and distance of the seating point determines that the direction and distance of a center of a seating point group formed by a plurality of seating points in which the magnitude of the change in the seating point per unit time exceeds the second threshold change amount are the direction and distance of the seating point deviated from the seating center point.

An aspect of a method for controlling a process of the present invention relates to a method performed by an apparatus for controlling a transfer robot provided in a semiconductor process facility, in which the method includes determining deviation tendency of a seating point of a substrate with respect to a seating center point of a substrate support based on a seating point data created by accumulating the seating points of the substrate seated on the substrate support, determining an alarm level according to the determined deviation tendency, and performing post-processing according to the determined alarm level, in which the seating point data includes a change of the seating point over time.

Other specific details of embodiments are included in the detailed description and drawings.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Hereinafter, preferred embodiments of the present invention will be described in detail with reference to the accompanying drawings. Benefits and features of the present invention, and methods for achieving them will be clarified with reference to embodiments described below in detail together with the accompanying drawings. However, the present invention is not limited to the embodiments disclosed below, but may be implemented in various different forms. The embodiments are provided only to make the disclosure of the present invention complete, and to fully inform the scope of the invention to those skilled in the art to which the present invention pertains. The invention is only defined by the scope of the claims. Like reference numerals refer to like elements throughout the specification.

When it is referred that elements are "on" or "above" the other elements, it includes a case where other elements are interposed in the middle as well as directly above other elements. On the other hand, when it is referred that elements are "directly on" or "directly above" other elements, it indicates that there are no intervening elements or layers.

The spatially relative terms "below," "beneath," "lower," "above," "upper," or the like may be used to easily describe the correlation between one element and other elements as shown in the drawings. The spatially relative terms should be understood as terms including different directions of an element in use or operation in addition to the directions shown in the drawings. For example, if elements shown in the drawings are turned over, elements described as "below" or "beneath" of other elements may be placed "above" other elements. Accordingly, an exemplary term "below" may include both the directions below and above. Elements may also be oriented in different directions, so that the spatially relative terms may be interpreted depending on the orientation.

Although the first, second, etc. are used to describe various elements, components, and/or sections, it goes without saying that these elements, components, and/or sections are not limited by these terms. These terms are only used to distinguish one element, component, or section from other elements, components, or sections. Accordingly, it goes without saying that a first element, a first component, or a first section mentioned below may be a second element, a second component, or a second section within the technical spirit of the present invention.

The terms used herein are for the purpose of describing embodiments and are not intended to be limiting of the present invention. Herein, the singular also includes the plural unless specifically stated otherwise in the phrase. The terms "comprises" and/or "comprising" as used herein do not exclude the presence or addition of one or more other components, steps, operations, and/or elements mentioned.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, embodiments of the present invention will be described in detail with reference to the accompanying drawings. In the description with reference to the accompanying drawings, the same or corresponding components are assigned the same reference numbers regardless of drawing numbers, and redundant description thereof will be omitted.

Figure 1:
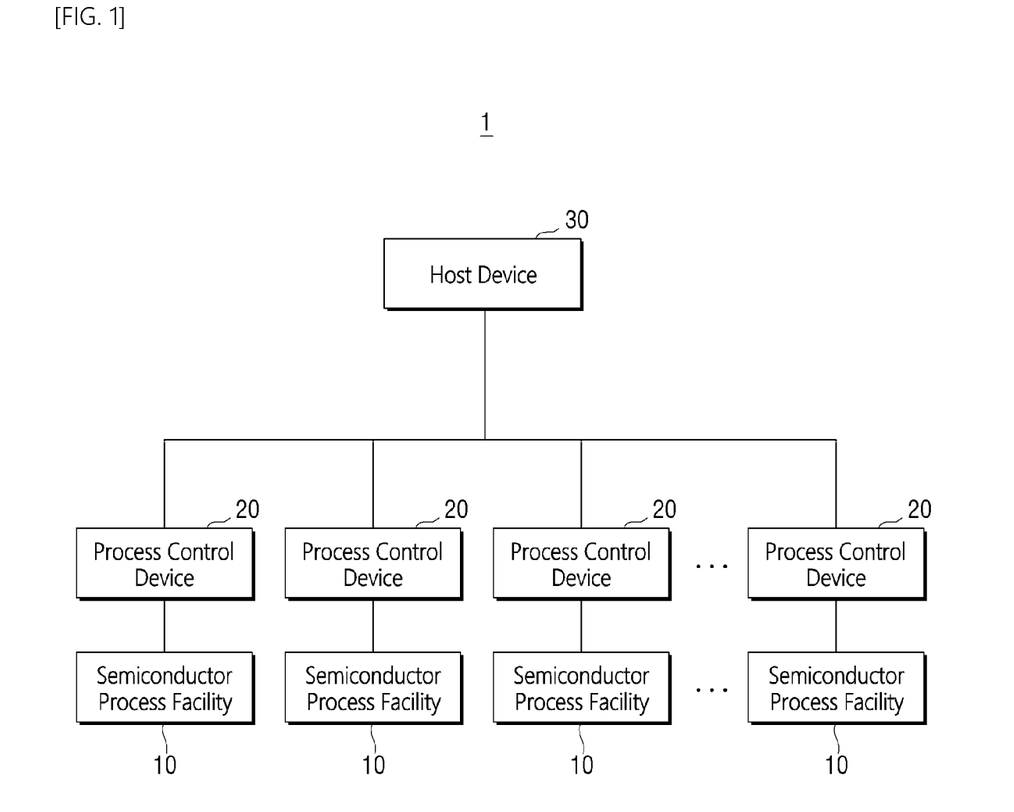
FIG. 1 is a diagram showing a process control system according to an embodiment of the present invention.

FIG. 1 is a diagram showing a process control system according to an embodiment of the present invention.

Referring to FIG. 1, a process control system 1 includes a semiconductor process facility 10, a process control device 20, and a host device 30.

The semiconductor process facility 10 may perform a process on a semiconductor component or a display component. For example, the semiconductor process facility 10 may perform processes such as photographing, etching, ashing, ion implantation, thin film deposition, or cleaning.

Each semiconductor process facility 10 may perform a unique process by having a plurality of units that perform tasks. The plurality of units may be appropriately arranged and perform for a unique process of the corresponding semiconductor process facility 10.

The process control device 20 may control an operation of a unit included in the semiconductor process facility 10. As will be described later, the semiconductor process facility 10 may include a process chamber that performs processing on a substrate and a transfer robot that transports the substrate. The process control device 20 may control operations of, for example, the process chamber and the transfer robot. In particular, when a seating point of the substrate by the transfer robot deviates from a reference point, the process control device 20 may set a movement offset of the transfer robot.

FIG. 1 shows that each semiconductor process facility 10 is equipped with the process control device 20. However, it is an example, and a plurality of process control devices 20 may control an operation of one semiconductor process facility 10. In addition, one process control device 20 may control an operation of a plurality of semiconductor process facility 10. A detailed description of the process control device 20 will be described later with reference to FIG. 3.

The host device 30 may store data collected by the process control device 20. Also, the host device 30 may control the operation of the process control device 20 based on the collected data. The host device 30 may control the operation of the entire process control device 20 or control the operation of the specific process control device 20 based on data collected from the plurality of process control devices 20. For example, when a movement error of the transfer robot performing a specific role included in the plurality of semiconductor process facility 10 forms a constant pattern, the host device 30 may control the process control device 20 to set a movement offset of a corresponding transfer robot included in the entire semiconductor process facility 10.

Figure 2:
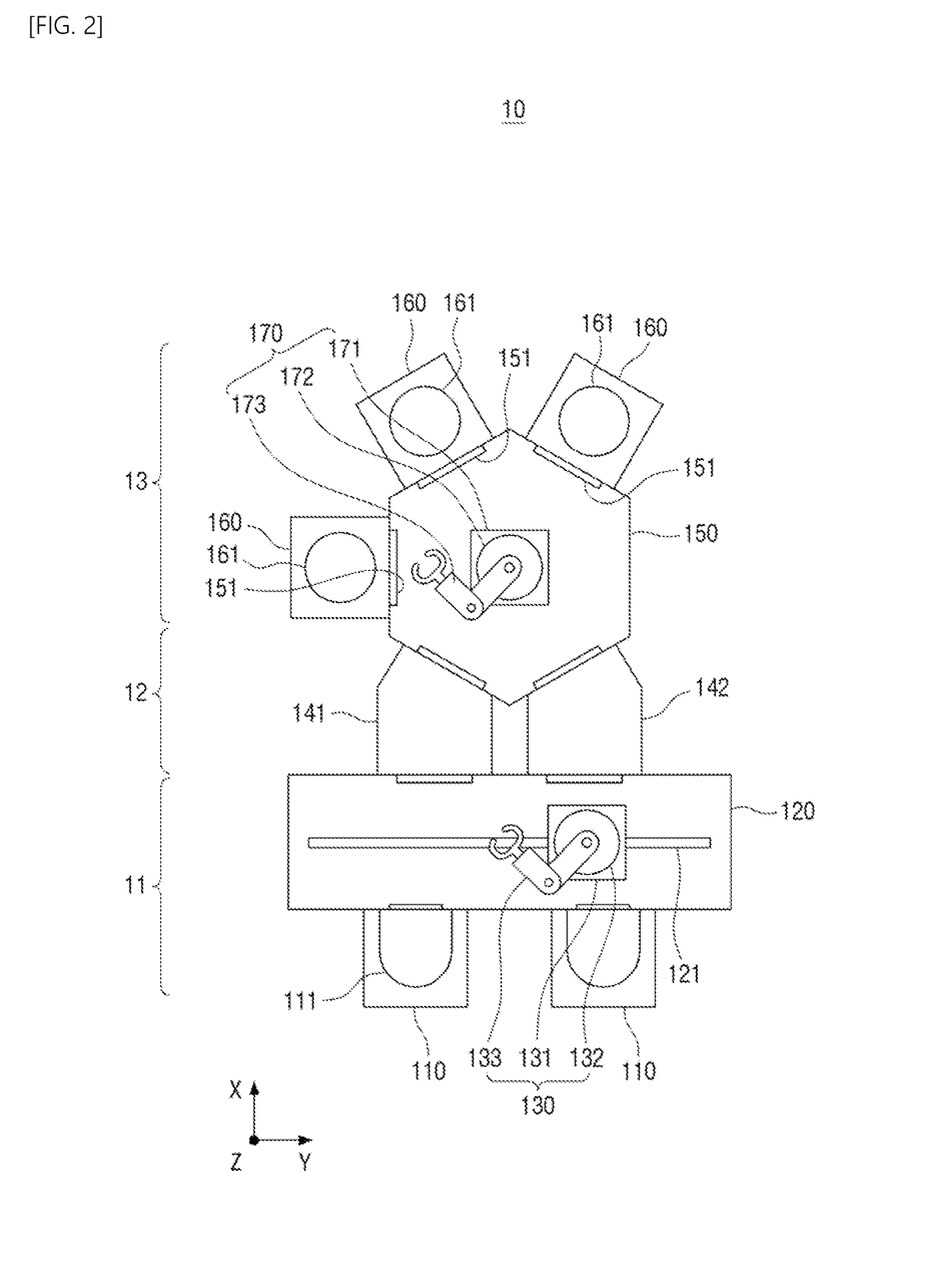
FIG. 2 is a diagram showing a semiconductor process facility shown in FIG. 1.

FIG. 2 is a diagram showing a semiconductor process facility shown in FIG. 1.

Referring to FIG. 2, a semiconductor process facility 10 includes an index module 11, a loading module 12, and a process module 13.

The index module 11, the loading module 12, and the process module 13 may be arranged in a line. Hereinafter, the direction in which the index module 11, the loading module 12, and the process module 13 are arranged is referred to as a first direction X, the direction perpendicular to the first direction X when viewed from the top is called a second direction Y, and the direction perpendicular to the plane including the first direction X and the second direction Y is referred to as a third direction Z.

The index module 11 serves to insert the substrate into the process module 13 and to take out the substrate that has been processed from the process module 13. The loading module 12 may be provided between the index module 11 and the process module 13. The index module 11 may insert the substrate into the process module 13 through the loading module 12 or take out the substrate from the loading module 12.

The index module 11 may transfer the substrate from a carrier 111 in which the substrate is accommodated to the loading module 12 and accommodate the substrate discharged from the loading module 12 in the carrier 111. The index module 11 may include a load port 110 and a transfer frame 120.

The carrier 111 may be seated in the load port 110. A plurality of substrates may be accommodated in the carrier 111. A plurality of load ports 110 may be provided, and a plurality of load ports 110 may be arranged in a line in the second direction Y.

The transfer frame 120 serves to transfer the substrate between the carrier 111 and the loading module 12. The transfer frame 120 may include an index rail 121 and an index robot 130.

The index rail 121 may be arranged to be elongated in parallel to the second direction Y. The index robot 130 is installed on the index rail 121 and may move along the index rail 121 in the second direction Y. The index robot 130 may include an index base 131, an index body 132, and an index arm 133. The index base 131 may be installed on the index rail 121 so as to be movable along the index rail 121. The index body 132 may be coupled to the index base 131 to move along the index rail 121 together with the index base 131. In addition, the index body 132 may move along the third direction Z with respect to the index base 131, and may rotate around a rotation axis parallel to the third direction Z.

The index arm 133 directly supports the substrate and serves to transfer the substrate. To this end, the index arm 133 may include a plurality of joints capable of adjusting an angle or length of each other.

The loading module 12 serves to relay the substrate between the process module 13 in a vacuum atmosphere and the index module 11 in an atmospheric pressure atmosphere by converting the atmosphere into the vacuum atmosphere or the atmospheric pressure atmosphere. The inside of the process module 13 may be a vacuum atmosphere, and the index module 11 may be an atmospheric pressure atmosphere. The loading module 12 may be provided to exchange the substrate between the process module 13 and the index module 11 while maintaining the vacuum atmosphere of the process module 13 as it is.

The loading module 12 may include a load lock chamber 141 and an unload lock chamber 142. The load lock chamber 141 and the unload lock chamber 142 may be provided so that the atmosphere of an inner space may be converted into the vacuum atmosphere or the atmospheric pressure atmosphere.

The load lock chamber 141 serves to temporarily accommodate the substrate transferred from the index module 11 to the process module 13. The unload lock chamber 142 serves to temporarily accommodate the substrate transferred from the process module 13 to the index module 11.

The process module 13 may perform process processing on the substrate. The process module 13 may include a transfer chamber 150 and a process chamber 160. A plurality of process chambers 160 may be provided.

The transfer chamber 150 may provide a space for relaying the substrate between the load lock chamber 141, the unload lock chamber 142, and the process chamber 160. To this end, the load lock chamber 141, the unload lock chamber 142, and the process chamber 160 may be arranged along an edge of the transfer chamber 150. FIG. 1 shows that the load lock chamber 141, the unload lock chamber 142, and three process chambers 160 are arranged along the edge of the transfer chamber 150 having a hexagonal shape. A shape of the transfer chamber 150 of the present invention is not limited to the hexagonal shape, and the shape of the transfer chamber 150 may vary depending on the number of process chambers 160 and a process environment.

A process door 151 may be provided for each process chamber 160. In a state in which the process door 151 is open, the transfer chamber 150 and the process chamber 160 may carry in or carry out the substrate. When the process door 151 is closed, a process processing operation by the process chamber 160 may be performed.

A transfer robot 170 may be provided inside the transfer chamber 150. The transfer robot 170 serves to transfer the substrate between the load lock chamber 141, the unload lock chamber 142, and the process chamber 160. For example, the transfer robot 170 may move the substrate carried out from the load lock chamber 141 and carry it into the process chamber 160, and may move the substrate carried out from the process chamber 160 and carry it into the unload lock chamber 142.

The transfer robot 170 may include a transfer base 171, a transfer body 172, and a transfer arm 173. The transfer base 171 may be arranged at a center of the transfer chamber 150. The transfer body 172 may move along the third direction Z with respect to the transfer base 171, and may rotate around a rotation axis parallel to the third direction Z.

The transfer arm 173 directly supports the substrate and serves to transfer the substrate. To this end, the transfer arm 173 may include a plurality of joints capable of adjusting an angle or length of each other. Accordingly, the transfer arm 173 may move parallel to a plane including the first direction X and the second direction Y.

The process chamber 160 may perform a specific task on the substrate. For example, the process chamber 160 may perform etching or deposition treatment on the substrate. The process module 13 may include a plurality of process chambers 160, and may perform the same or different tasks for each process chamber 160.

The operation of the index module 11, the loading module 12, and the process module 13 may be controlled by the process control device 20. For example, the process control device 20 may receive an operating state from the index module 11, the loading module 12, and the process module 13, and may schedule the operation of the index module 11, the loading module 12, and the process module 13 in a direction in which the number of substrates to be processed per unit time increases with reference to the received operation state.

In addition, the process control device 20 may control the operation of the transfer robot 170 provided in the transfer chamber 150. The process chamber 160 may include a substrate support 161 supporting the substrate. A process for the substrate may be performed while the substrate is supported by the substrate support 161. For example, the substrate support 161 may be an electrostatic chuck that supports the substrate with an electrostatic force. The process control device 20 may control the operation of the transfer robot 170 so that the substrate is seated at a correct position of the substrate support 161.

Figure 3:
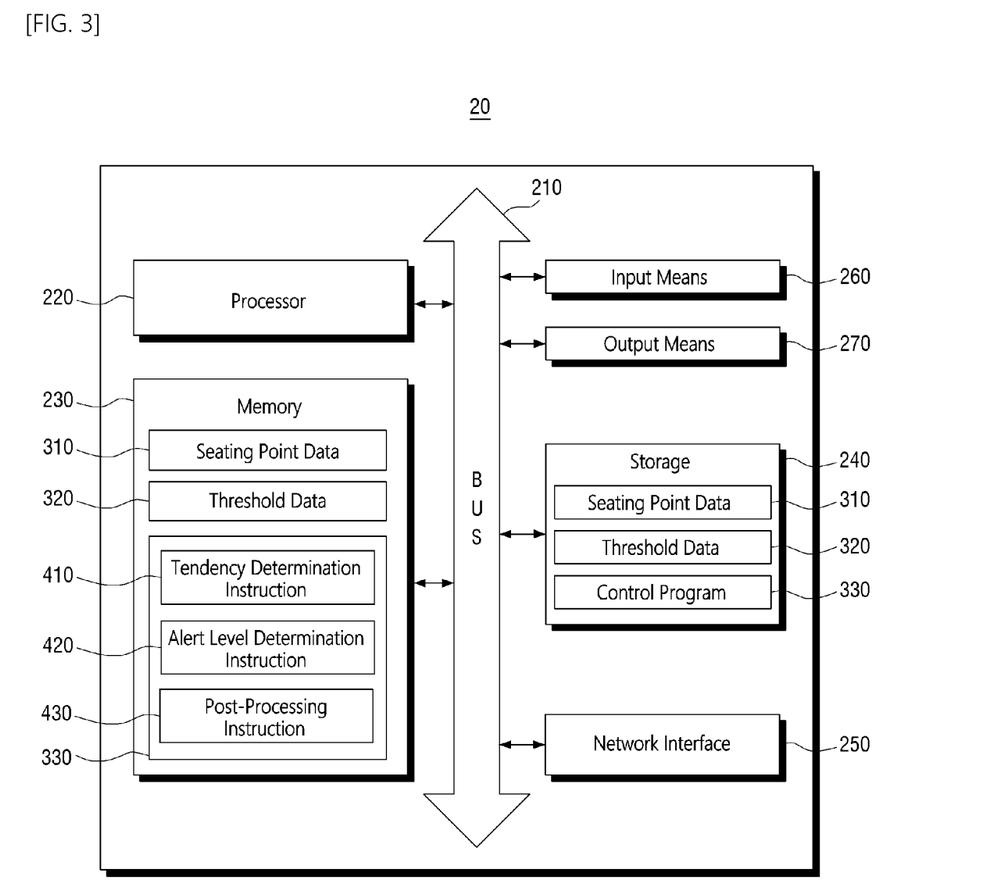
FIG. 3 is a block diagram showing a process control device shown in FIG. 1.
Figure 4:
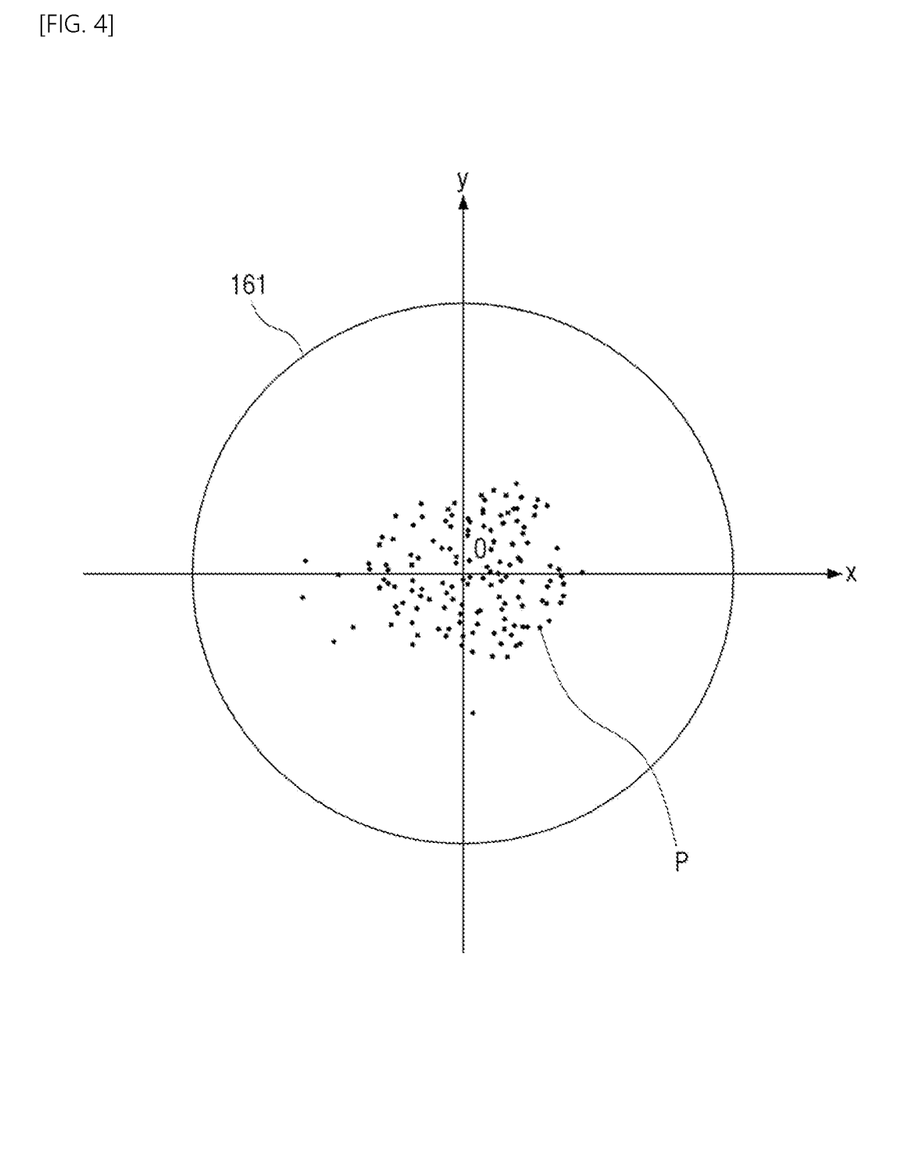
FIG. 4 is a diagram showing a distribution of seating points of a substrate seated on a substrate support of a process chamber shown in FIG. 2.

The substrate support 161 may include a seating center point O (see FIG. 4). The seating center point O is a center of the substrate support 161, and when the substrate is seated so that a center of the substrate coincides with the seating center point O, an optimal processing environment for the substrate may be provided. As the substrate is continuously transferred by the transfer robot 170, the seating point of the substrate may gradually deviate from the seating center point O. In the present invention, the seating point of the substrate represents a center position of the substrate seated on the substrate support 161, and a separate measuring means (not shown) for measuring the seating point may be provided. When a distance between the seating point of the substrate and the seating center point O is out of a limit value, the process for the substrate may not be performed correctly. The process control apparatus 20 may control the operation of the transfer robot 170 so that the distance between the seating point of the substrate and the seating center point O does not exceed the limit value. Hereinafter, a configuration and operation of the process control device 20 will be described with reference to FIG. 3.

Figure 5:
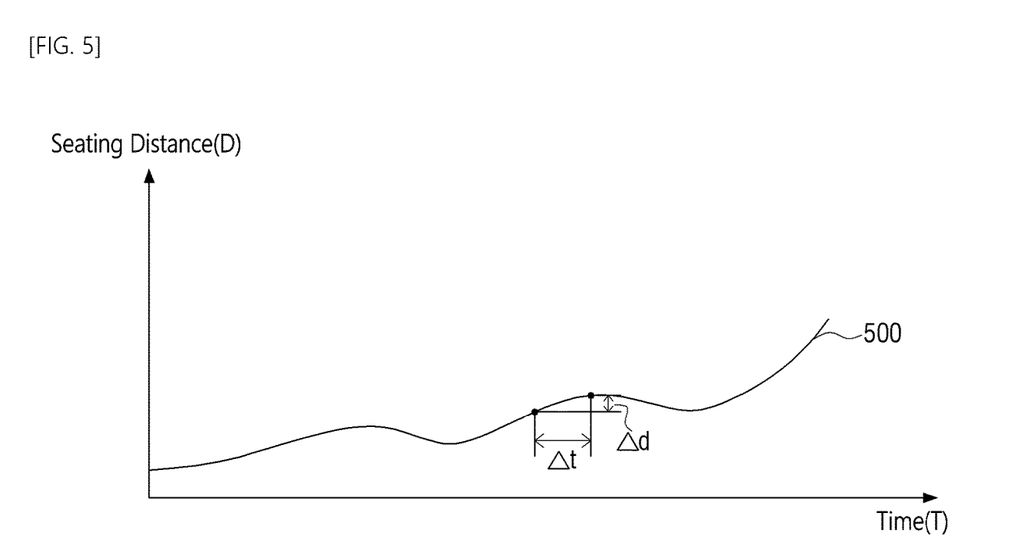
FIG. 5 is a graph showing the distribution of the seating points of the substrate shown in FIG. 4 over time.
Figure 6:
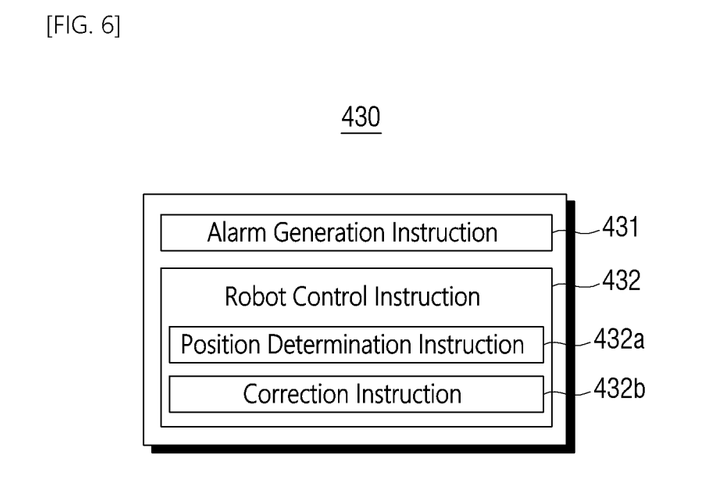
FIG. 6 is a diagram showing a detailed configuration of a post-processing instruction shown in FIG. 3.
Figure 7:
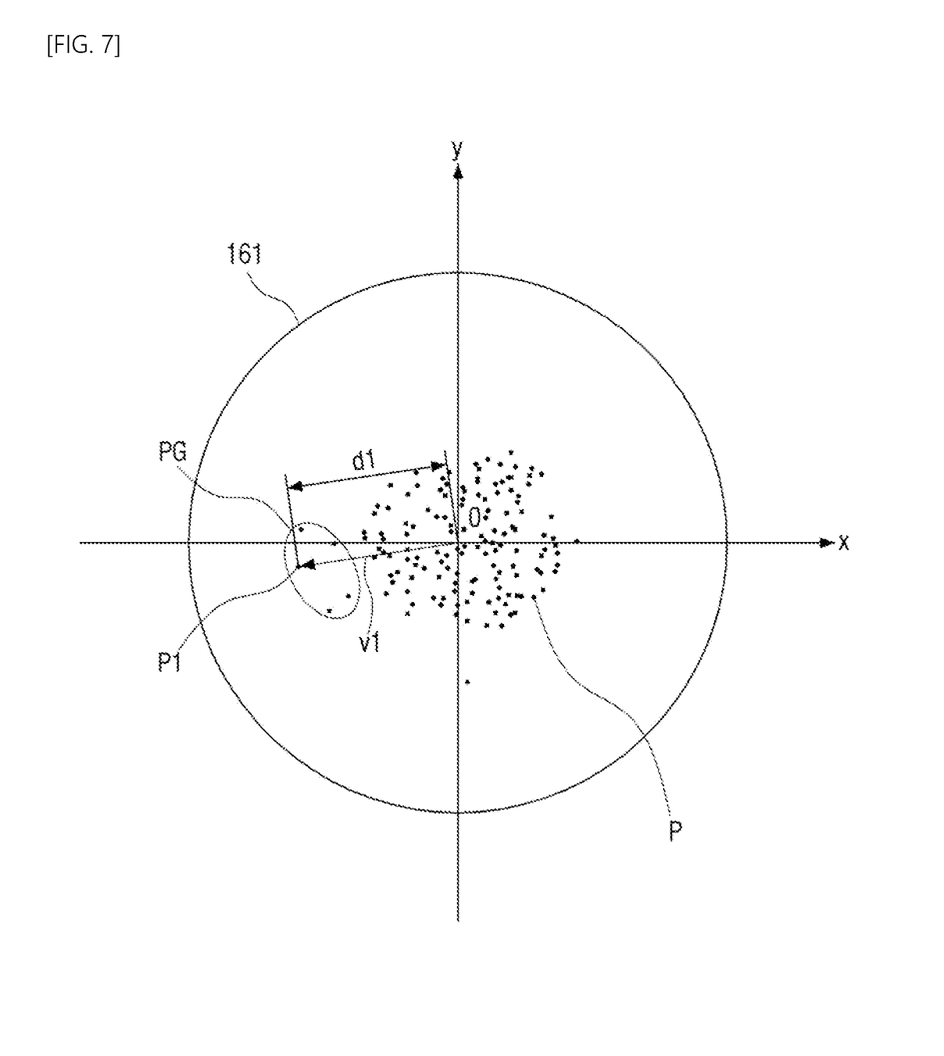
FIGS. 7 and 8 are diagrams for explaining calculation of a movement offset of a transfer robot provided in the semiconductor process facility shown in FIG. 3.
Figure 8:
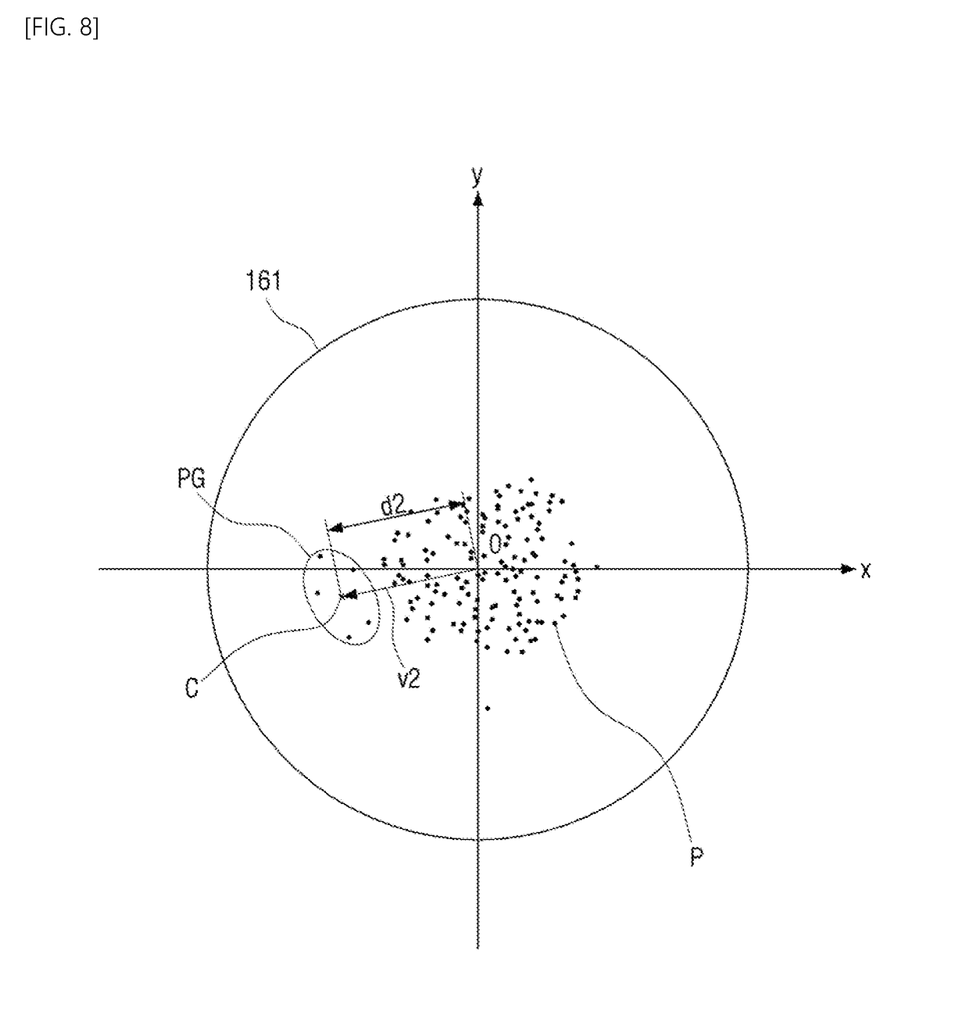

FIG. 3 is a block diagram showing a process control device shown in FIG. 1. FIG. 4 is a diagram showing a distribution of seating points of a substrate seated on a substrate support of a process chamber shown in FIG. 2. FIG. 5 is a graph showing the distribution of the seating points of the substrate shown in FIG. 4 over time. FIG. 6 is a diagram showing a detailed configuration of a post-processing instruction shown in FIG. 3. FIGS. 7 and 8 are diagrams for explaining calculation of a movement offset of a transfer robot provided in the semiconductor process facility shown in FIG. 3.

Referring to FIG. 3, the process control device 20 includes a system bus 210, a processor 220, a memory 230, a storage 240, a network interface 250, an input means 260, and an output means 270.

The system bus 210 may serve as a data transmission/reception path between the processor 220, the memory 230, the storage 240, the network interface 250, the input means 260, and the output means 270.

The memory 230 may be, for example, a volatile data storage device such as a random access memory (RAM). The storage 240 may be a non-volatile data storage device such as a flash memory or a hard disk.

In the present invention, an instruction refers to a series of commands grouped on the basis of a function and is executed by the processor 220.

The storage 240 may store seating point data 310, threshold data 320, and execution codes of a control program 330.

The seating point data 310 may be created by accumulating seating points of the substrate seated on the substrate support 161. Referring to FIG. 4, as the process in which different substrates are seated on the substrate support 161 is repeated, a distribution of a seating point P with respect to the center of the substrate support 161 may be formed. The seating point data 310 may include two-dimensional coordinates of a plurality of seating points P.

The seating point data 310 may be created for each process chamber 160. A plurality of process chambers 160 may be provided for each semiconductor process facility 10 of the process control system 1, in which the seating point data 310 may be created for each process chamber 160.

The seating point data 310 may include a change in the seating point over time. The change of the seating point over time may be determined through the seating point data 310, in which the seating point data 310 may include listing seating distances between the seating center point O and the seating point in chronological order. Referring to FIG. 5, a seating distance D may vary over time T. As the operation of the transfer robot 170 is repeatedly performed, parts included in the transfer robot 170 may be worn or deteriorated. Due to this, the precision of the transfer robot 170 may decrease and the seating distance may increase. The seating point data 310 may include the seating distance D over the time T. FIG. 5 shows that the seating distance D over the time T is represented by a graph (hereinafter, referred to as a seating distance graph) 500.

Referring to FIG. 3 again, the threshold data 320 may include a threshold change amount and a threshold distance. The threshold change amount represents a reference for determining an alert level to be described later, and the threshold distance represents a reference for determining a movement offset of the transfer robot 170.

The control program 330 may include at least one execution code to control the operation of the transfer robot 170 provided in the semiconductor process facility 10. The executable code may be provided in the form of instructions, and the control program 330 may include a plurality of instructions to perform control on the transfer robot 170.

The memory 230 may temporarily store at least some of information stored in the storage 240. For example, the seating point data 310, the threshold data 320, and the control program 330 may be loaded in the memory 230. The control program 330 may be loaded into the memory 230 and operated. Here, the seating point data 310 and the threshold data 320 loaded in the memory 230 may be used.

The control program 330 may include a tendency determination instruction 410, an alert level determination instruction 420, and a post-processing instruction 430.

The tendency determination instruction 410 may determine deviation tendency of the seating point of the substrate with respect to the seating center point O of the substrate support 161 based on the seating point data 310. Here, the deviation tendency represents a change in distance between the seating center point O and the seating point over time. Referring to FIG. 5, the deviation tendency may be determined as a magnitude d of a change in the seating point per unit time t. When the magnitude d of the change in the seating point per unit time t is small, it may be determined that the deviation tendency is small. When the magnitude d of the change in the seating point per unit time t is large, it may be determined that the deviation tendency is large. However, this is an example. According to some embodiments of the present invention, the deviation tendency may be determined as a slope of a tangent line at a specific point to be determined in the seating distance graph 500.

The seating point data 310 may be updated in real time, and the tendency determination instruction 410 may determine the deviation tendency of the seating point by referring to the seating point data 310 updated in real time.

Referring to FIG. 3 again, the alert level determination instruction 420 may determine an alert level according to the deviation tendency determined by the tendency determination instruction 410. The alert level determination instruction 420 may determine the alert level by comparing the magnitude d of the change in the seating point per unit time t, i.e., the deviation tendency with a preset threshold change amount. The deviation tendency is determined by the tendency determination instruction 410, and the threshold change amount may be included in the threshold data 320 stored in the memory 230.

The threshold change amount may include a first threshold change amount and a second threshold change amount. The second threshold change amount may be set larger than the first threshold change amount. The alert level determined by the alert level determination instruction 420 may include a first alert level and a second alert level. The first alert level may be that the magnitude d of the change in the seating point per unit time t exceeds the first threshold change amount, and the second alert level may be that the magnitude of the change in the seating point per unit time t exceeds the second threshold change amount.

The post-processing instruction 430 may perform post-processing according to the alert level determined by the alert level determination instruction 420. Referring to FIG. 6, the post-processing instruction 430 may include an alarm generation instruction 431 and a robot control instruction 432.

The alarm generation instruction 431 may control the generation of an alarm, and the robot control instruction 432 may control the transfer robot 170. Specifically, the alarm generation instruction 431 may generate an alarm in the case of the first alarm level, and the robot control instruction 432 may control the transfer robot 170 in the case of the second alarm level.

When the threshold change amount is relatively small, an alarm may be generated by the alarm generation instruction 431. A user may perform subsequent processing to correct the seating point through the alarm.

When the threshold change amount is relatively large, the operation of the transfer robot 170 may be controlled by the robot control instruction 432. The robot control instruction 432 may include a position determination instruction 432a and a correction instruction 432b.

The position determination instruction 432a may determine a direction and distance of the deviated seating point with respect to the seating center point O. Referring to FIG. 7, the position determination instruction 432a may determine that a direction v1 and a distance d1 of a seating point P1 furthest from the seating center point O among a seating point group PG formed by the plurality of seating points in which the magnitude d of the change d of the seating point per unit time t exceeds the second threshold change amount is the direction v1 and the distance d1 of the seating point deviated from the seating center point O (hereinafter, referred to as a deviation direction and a deviation distance).

The magnitude d of the change in the seating point per unit time t may be determined through the plurality of seating points identified within the unit time t. When a slope determined by the plurality of seating points exceeds the second threshold change amount, the seating point group PG may be formed by the plurality of seating points. The position determination instruction 432a may determine that the direction v1 and the distance d1 of the seating point P1 farthest from the seating center point O among the seating points included in the seating point group PG are the deviation direction and the deviation distance. Here, the deviation direction v1 and the deviation distance d1 represent those determined based on the seating center point O.

In addition, as shown in FIG. 8, the position determination instruction 432a may also determine that a direction v2 and a distance d2 of a center C of the seating point group PG formed by the plurality of seating points in which the magnitude d of the change in the seating point per unit time t exceeds the second threshold change amount are the direction and the distance of the seating point deviated from the seating center point O.

Referring to FIG. 6 again, the correction instruction 432b may set the movement offset of the transfer robot 170 according to the direction and the distance determined by the position determination instruction 432a. The transfer robot 170 may set the substrate on the substrate support 161 by adjusting a position by the movement offset by the correction instruction 432b.

Referring to FIG. 2 again, the input means 260 may receive a user command. For example, the input means 260 may receive the movement offset of the transfer robot 170. When an alarm is generated at the first alarm level, the user may manually input the movement offset through the input means 260. Accordingly, the transfer robot 170 may seat the substrate by adjusting the position according to the movement offset.

The output means 270 may output an alarm. For example, the output means 270 may display an alarm in a visual or audible manner. To this end, the output means 270 may include a display device (not shown) and a speaker device (not shown).

The network interface 250 may communicate with the semiconductor process facility 10. The network interface 250 may transmit a control command to the semiconductor process facility 10 and receive monitoring information from the semiconductor process facility 10. Here, the control command may include a task order by the post-processing instruction 430, and the monitoring information may include information on a task performed in the corresponding semiconductor process facility 10.

In addition, the network interface 250 may receive a control command from the host device 30. As described above, the host device 30 may store data collected by the process control device 20. Also, the host device 30 may create a control command for controlling the operation of the process control device 20 based on the collected data, and may transmit the created control command.

The control command transmitted from the host device 30 may include the movement offset of the transfer robot 170. The process control device 20 may seat the substrate by adjusting the position according to the movement offset included in the control command.

The embodiments of the present invention have been described with reference to the accompanying drawings. However, it may be understood that those of ordinary skill in the art to which the present invention pertains may implement the present invention in other specific forms without changing its technical spirit or essential features. Therefore, it should be understood that the embodiments described above are exemplary in all respects and not restrictive.

| Reference Numeral | |
|---|---|
| 1: process control system | 10: semiconductor process facility |
| 11: index module | 12: loading module |
| 13: process module | 20: process control device |
| 30: host device | 110: load port |
| 120: transfer frame | 130: index robot |
| 141: load lock chamber | 142: unload lock chamber |
| 150: transfer chamber | 160: process chamber |
| 161: substrate support | 170: transfer robot |
| 210: system bus | 220: processor |
| 230: memory | 240: storage |
| 250: network interface | 260: input means |
| 270: output means | |

What is claimed is:

1. A system for controlling a process, comprising:
a semiconductor process facility includes a process chamber configured to perform processing on a substrate and a transfer robot configured to transport the substrate; and
an apparatus for controlling a process configured to control operations of the process chamber and the transfer robot,
the apparatus comprising:
a processor, and
a memory for storing a plurality of instructions executed by the processor,
wherein the plurality of instructions comprise:
an instruction for determining deviation tendency of a seating point of the substrate with respect to a seating center point of a substrate support based on seating point data created by accumulating the seating points of the substrate seated on the substrate support;
an instruction for determining an alarm level according to the determined deviation tendency; and
an instruction for performing post-processing according to the determined alarm level, the instruction for performing post-processing comprising an instruction for controlling a transfer robot that moves the substrate, the instruction for controlling the transfer robot comprising an instruction for determining a direction and a distance of a seating point deviation from the seating center point based on a seating point group formed by a plurality of prior seating points.

2. The system of claim 1, wherein the seating point data comprises a change of the seating point over time.

3. The system of claim 2, wherein the seating point data comprises listing seating distances between the seating center point and the seating point of the substrate in chronological order.

4. The system of claim 2, wherein the instruction for determining the alarm level determines the alarm level by comparing a magnitude of a change in the seating point per unit time with a preset threshold change amount.

5. The system of claim 4, wherein the alarm level comprises:
a first alarm level in which the magnitude of the change in the seating point per unit time exceeds a first threshold change amount; and
a second alarm level in which the magnitude of the change in the seating point per unit time exceeds a second threshold change amount greater than the first threshold change amount.

6. The system of claim 5, wherein the instruction for performing post-processing
further comprises an instruction for generating an alarm in case of the first alarm level; and
the instruction for controlling the transfer robot that moves the substrate is used in case of the second alarm level.

7. The system of claim 6, wherein the instruction for controlling the transfer robot
further comprises an instruction for setting a movement offset of the transfer robot according to the determined direction and distance.

8. The system of claim 7, wherein the instruction for determining the direction and distance of the seating point determines that a direction and distance of a seating point farthest from the seating center point among the seating point group are the direction and distance of the seating point deviation from the seating center point, wherein the plurality of prior seating points are seating points in which the magnitude of the change in the seating point per unit time exceeds the second threshold change amount.

9. The system of claim 7, wherein the instruction for determining the direction and distance of the seating point determines that a direction and distance of a center of the seating point group are the direction and distance of the seating point deviation from the seating center point, wherein the plurality of prior seating points are seating points in which the magnitude of the change in the seating point per unit time exceeds the second threshold change amount.

10. A system for controlling a process, comprising:
a semiconductor process facility includes a process chamber configured to perform processing on a substrate and a transfer robot configured to transport the substrate; and
an apparatus for controlling a process configured to control operations of the process chamber and the transfer robot,
the apparatus comprising:
a processor, and
a memory for storing a plurality of instructions executed by the processor,
wherein the plurality of instructions comprise:
an instruction for determining deviation tendency of a seating point of a substrate with respect to a seating center point of a substrate support based on seating point data created by accumulating the seating points of the substrate seated on the substrate support;
an instruction for determining an alarm level according to the determined deviation tendency; and
an instruction for performing post-processing according to the determined alarm level, the instruction for performing post-processing comprising an instruction for controlling a transfer robot that moves the substrate, the instruction for controlling the transfer robot comprising an instruction for determining a direction and a distance of a seating point deviation from the seating center point based on a seating point group formed by a plurality of prior seating points,
wherein the seating point data comprises a change of the seating point over time,
wherein the seating point data comprises listing seating distances between the seating center point and the seating point of the substrate in chronological order,
wherein the instruction for determining the alarm level determines the alarm level by comparing a magnitude of a change in the seating point per unit time with a preset threshold change amount,
wherein the alarm level comprises:
a first alarm level in which the magnitude of the change in the seating point per unit time exceeds a first threshold change amount; and
a second alarm level in which the magnitude of the change in the seating point per unit time exceeds a second threshold change amount greater than the first threshold change amount.

11. A method performed by a system for controlling a process, the system comprising a semiconductor process facility includes a process chamber configured to perform processing on a substrate and a transfer robot configured to transport the substrate and an apparatus for controlling operations of the process chamber and the transfer robot provided in the semiconductor process facility, comprising:
determining, by an instruction for determining deviation tendency of a seating point of a substrate, the deviation tendency of the seating point of the substrate with respect to a seating center point of a substrate support based on seating point data created by accumulating the seating points of the substrate seated on the substrate support;

determining, by an instruction for determining an alarm level, the alarm level according to the determined deviation tendency; and performing, by an instruction for performing post-processing, post-processing according to the determined alarm level, the instruction for performing post-processing comprising an instruction for controlling the transfer robot, the instruction for controlling the transfer robot comprising an instruction for determining a direction and a distance of a seating point deviation from the seating center point based on a seating point group formed by a plurality of prior seating points.

12. The method of claim 11, wherein the seating point data comprises a change of the seating point over time.

13. The method of claim 12, wherein the seating point data comprises listing seating distances between the seating center point and the seating point of the substrate in chronological order.

14. The method of claim 12, wherein the instruction for determining the alarm level determines the alarm level by comparing a magnitude of a change in the seating point per unit time with a preset threshold change amount.

15. The method of claim 14, wherein the alarm level comprises:

a first alarm level in which the magnitude of the change in the seating point per unit time exceeds a first threshold change amount; and a second alarm level in which the magnitude of the change in the seating point per unit time exceeds a second threshold change amount greater than the first threshold change amount.

* * * * *